United States Patent [19]
Grove

[11] 4,064,456
[45] Dec. 20, 1977

[54] METER BOX ASSEMBLY
[75] Inventor: Clark Richard Grove, Boron, Calif.
[73] Assignee: The United States of America as represented by the Secretary of the Air Force, Washington, D.C.
[21] Appl. No.: 675,434
[22] Filed: Apr. 9, 1976
[51] Int. Cl.² .......... G01R 15/08; G01B 7/16
[52] U.S. Cl. ............... 324/115; 73/88.5 R; 324/140 R
[58] Field of Search ......... 324/115, 130, 140 R; 73/88.5 R, 88.5 SD

[56] References Cited
U.S. PATENT DOCUMENTS

| | | | |
|---|---|---|---|
| 3,390,329 | 6/1968 | Gewirtz | 324/115 |
| 3,535,637 | 10/1970 | Goransson | 324/130 |

Primary Examiner—Rudolph V. Rolinec
Assistant Examiner—Ernest F. Karlsen
Attorney, Agent, or Firm—Joseph E. Rusz; Jacob N. Erlich

[57] ABSTRACT

A meter box assembly capable of displaying signal magnitudes. The meter box assembly is in the form of a housing which encloses therein a plurality of circuits, each of the circuits being connected to a display unit on the housing. Each meter box assembly circuit combines in a novel arrangement a meter, switch module, voltmeter circuit and strain gage circuit in order to display in an accurate fashion voltages external to the meter box assembly or to display the voltage output of a strain gage transducer.

7 Claims, 3 Drawing Figures

METER BOX ASSEMBLY

STATEMENT OF GOVERNMENT INTEREST

The invention described herein may be manufactured and used by or for the Government for governmental purposes without the payment of any royalty thereon.

BACKGROUND OF THE INVENTION

The instant invention relates generally to instrumentation devices, and, more particularly to a meter box capable of displaying remote voltages or the voltage output of strain gage transducers used during the operation of complex electro/mechanical/pneumatic/hydraulic systems.

The field of instrumentation deals primarily with designing, manufacturing and utilizing physical instruments or instrument systems for detection, observation, measurement, automatic control, automatic computation, communication, or data processing. Instruments and instrument systems refine, extend or supplement human faculties and abilities to sense, perceive, communicate, remember, calculate or reason.

Instrumentation involves not only the design of individual instruments and components but also their integration with auxiliary or associated devices into instrument systems. In many instrument systems an auxiliary energy source, or field, is modified by the quantity to be measured, and a transducer is used to measure the modification. As an example, an x-ray beam penetrates a sheet of steel; the intensity of the emergent beam depends on, and is thus a measure of, the thickness of the sheet. An ionization chamber or a photocell transforms the ray intensity into electric current, which is further transformed into motion of the pointer on a meter. The position of the pointer is compared with a standard (the scale) which is calibrated in units of thickness. Vacuum pumps, x-ray tubes, lamps, batteries, electric signal generators (oscillators), sound or radio sources, radioactive sources, high-voltage electron or ion accelerators, wind tunnels, and shock tubes are all examples of equipment used to provide such auxiliary fields, beams, or conditions.

The general physical and mathematical principles underlying the operation of instruments and instrument systems are drawn from all branches of physics and engineering, primarily from physics. Instrumentation as a science is concerned with the development and study of these principles and techniques, their application to design of specific instruments, and the utilization of instruments in research, engineering, testing, industrial processes, communications, defense, education, and other areas. Thus the scope of instrumentation is nearly universal; in fact, it may well be called a common denominator of all science and technology.

Advances in science and technology make ever increasing demands on instrumentation. Every new area of investigation, for example, the exploration of space, generation of power by nuclear reactors, and determination of high-temperature properties of materials, presents new instrumentation problems. In general, instrumentation research seeks to attain higher accuracies, greater sensitivities, capability of measuring extreme values, applicability under extreme conditions of use, and capability of resolving changes or effects that occur at extremely high speeds.

A problem encountered in the many areas of instrumentation is that the expensive equipment in use today is being used inefficiently for required routine parameters at the expense of parameters requiring more costly equipment. It is therefore necessary to provide reliable, quick acting, inexpensive instrumentation for these routine parameters in order to release the more complex signal conditioning equipment for use by parameters requiring complex and expensive conditioning equipment.

SUMMARY OF THE INVENTION

The instant invention provides a meter box assembly capable of rapidly and accurately displaying signal magnitudes. The meter box assembly is in the form of a custom designed housing which encloses commercially available meters, switches, fuses, terminals, discrete passive and active electronic components, lamps and wires attached to a custom designed printed circuit board. The meters located within the housing panel display voltages external to the meter box assembly or display the output of strain gage bridge transducer signal conditioning amplifiers located within the meter box assembly.

The meter box assembly of this invention contains a plurality of display channels. Each channel has a meter that can be switched with a mode switch to measure the voltage from a voltmeter circuit or a strain gage circuit. The voltmeter circuit utilizes range resistors and a range switch to measure facility voltages of, for example, 0 to 50, 20, 10, 5 or 1 VDC. The range switch includes positions for a special range resistor, a variable range resistor, direct meter access and an open meter circuit. The strain gage circuit uses a strain gage signal conditioning module to measure the output of strain gage transducers. This module contains a small power supply and an amplifier.

The meter box assembly of the instant invention is employed by a console operator who sits in front of a console assembly with which the instant invention is incorporated, and operates switches on the panel of the assembly which remotely controls a system. The meter box assembly displays in a reliable and rapid manner system parameters to the console operator. The meter box assembly of this invention can be incorporated in any system, such as an electro/hydraulic/pneumatic/mechanical system, requiring remote control and visual display of analog data.

It is therefore an object of this invention to provide a meter box assembly that is capable of being permanently available for measuring routine parameters and thereby eliminating the use of more expensive equipment on a time-share basis with other users.

It is another object of this invention to provide a meter box assembly which includes therein a custom designed printed circuit board which allows the meters and amplifiers to be enclosed in a single housing without interconnecting cables and wires.

It is a further object of this invention to provide a meter box assembly capable of use and reuse with a plurality of electro/hydraulic/pneumatic/mechanical systems.

It still is a further object of this invention to provide a meter box assembly which is economical to produce and which utilizes conventional, currently available components that lend themselves to standard mass producing manufacturing techniques.

For a better understanding of the present invention together with other and further objects thereof reference is made to the following description taken in conjunction with the accompanying drawing and its scope will be pointed out in the appended claims.

DETAILED DESCRIPTION OF THE PREFERRED EMBODIMENT

Figure 1:
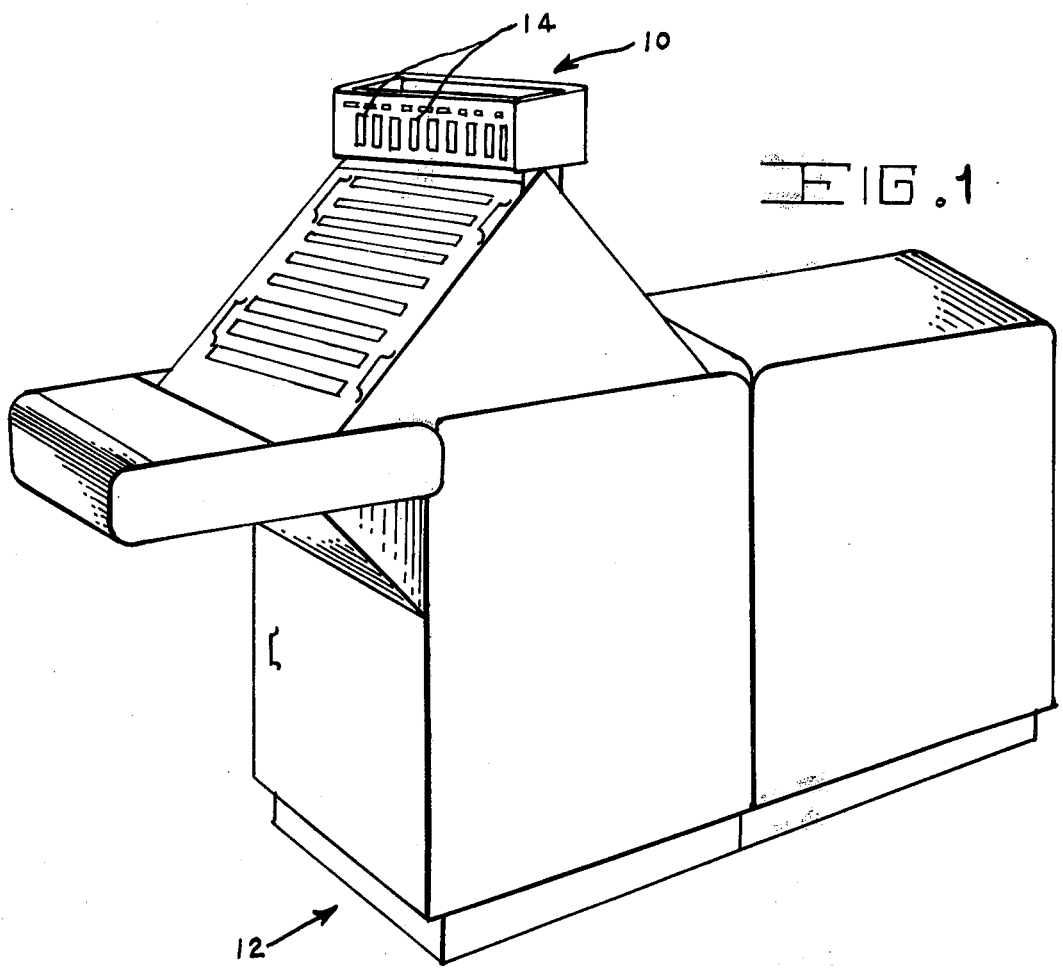
FIG. 1 is a pictorial representation of the meter box assembly of this invention shown in use on the control console of a conventional electro/hydraulic/pneumatic/mechanical system.

Reference is now made to FIG. 1 of the drawing which shows in pictorial fashion the meter box assembly 10 of this invention mounted upon any type of control console 12 which performs electro/mechanical/pneumatic/hydraulic operations. Meter box assembly 10 may contain therein any number of meter displays 14 which are illustrated in FIG. 1 as being, for example, nine in number.

Figure 2:
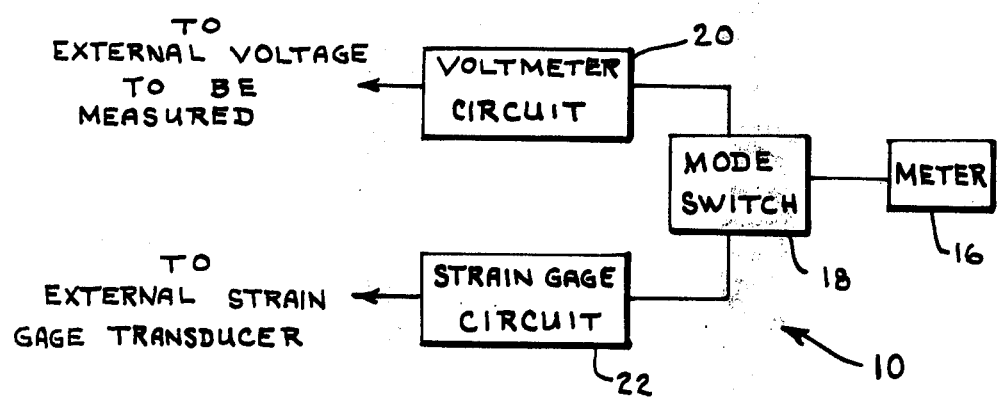
FIG. 2 is a schematic representation of the major components of the meter box assembly of this invention.

FIG. 2 of the drawing illustrates in the form of a flow diagram the components of meter box assembly 10. Each meter 16 is connected to a mode switch 18 and to a voltmeter circuit 20 and strain gage circuit 22. The voltmeter circuit 20 being attached to an external voltage source to be measured and strain gage circuit 22 being attached to an external strain gage transducer. Mode switch 18 is used to switch meter 16 in display 14 to either the voltmeter circuit 20 or the strain gage circuit 22. For each display 14 (shown in FIG. I) a separate meter, mode switch, voltmeter circuit and strain gage circuit is required.

Figure 3:
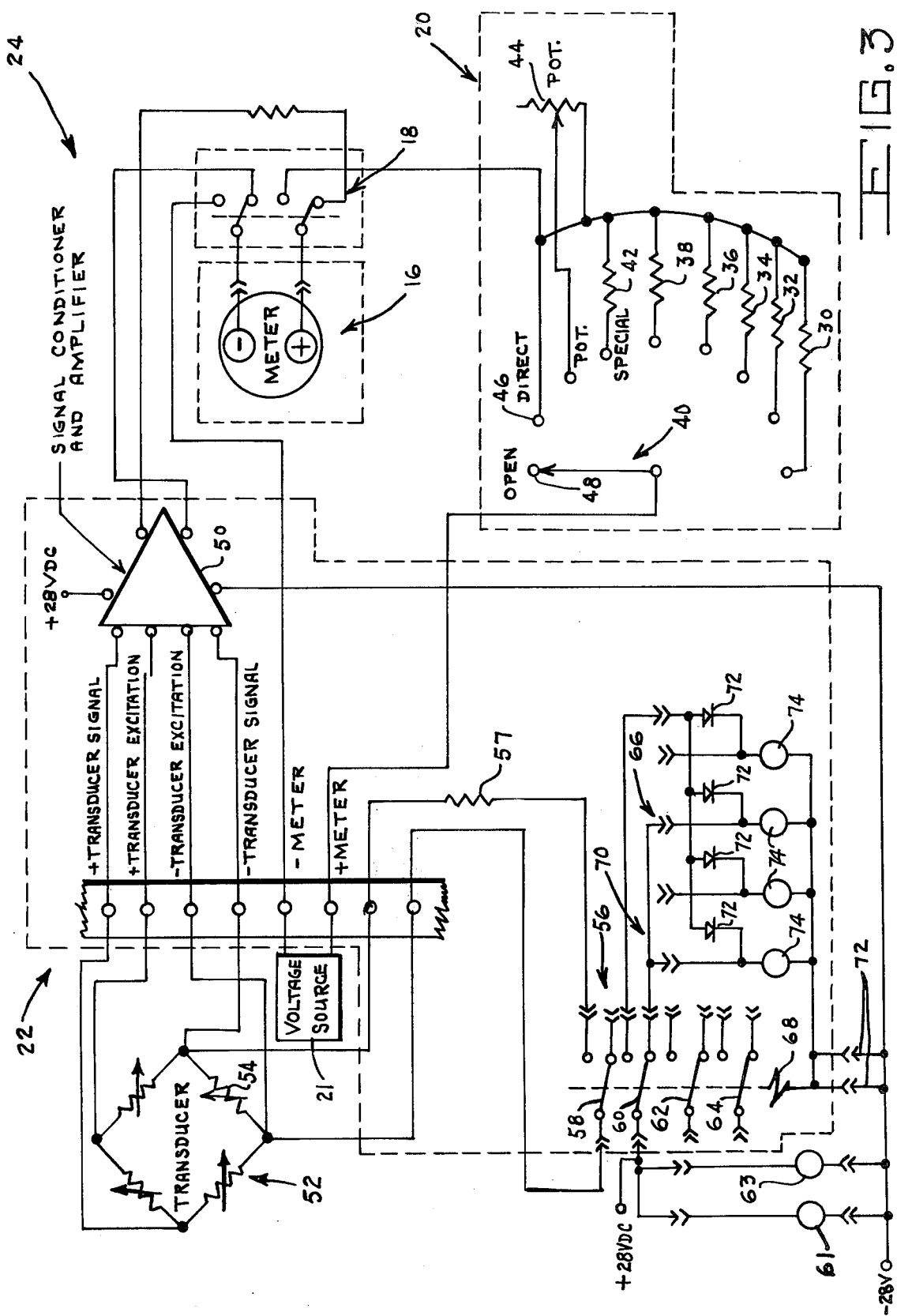
FIG. 3 is a schematic diagram of the circuit of the meter box assembly of this invention.

Reference is now made to FIG. 3 of the drawing which sets forth in schematic fashion the circuit 24 which makes up meter box assembly 10 of this invention. Only one such circuit 24 is shown in the drawing and described hereinbelow since this circuit 24 is typical for each of the plurality of displays 14 shown in FIG. 1 of the drawing.

Voltmeter circuit 20 electrically connects an external voltage source 21 by means of mode switch 18 to meter 16. The voltmeter circuit 20 is made up of a plurality of range resistors 30, 32, 34, 36 and 38 and a range switch 40 capable of measuring facility voltages of 0-50, 20, 10, 5 or 1 VDC. For example, resistor 30 may be 50V-49,920Ω, resistor 32 may be 20V-20,000 Ω, resistor 34, 10V-10,000 Ω, resistor 36, 5V-4990 Ω and resistor 38, 1V-976 Ω. Range switch 40 which is connected to voltage source 21 further includes positions for an additional or special range resistor 42, a variable range resistor 44, a direct meter access 46 and an open meter circuit 48 as shown in the drawing.

Still referring to FIG. 3, strain gage circuit 22, which is also electrically connected to meter 16 through mode switch 18, utilizes a strain gage conditioning or amplifier module 50 to measure the output of an external strain gage transducer 52. Module 50 is available through Viatran Corp. in Buffalo, New York as Model 602, Amplifier, and contains its own small power supply and amplifier. The power supply provides the excitation voltage for transducer 52 and the amplifier increases the output of transducer 52 to a usable level.

Across one leg 54 of transducer 52 is electrically connected a switch module 56 and a calibration resistor 57 which is utilized to establish electrical calibration of transducer 52 in a conventional manner. Switch module 56 as shown in FIG. 3 contains four switches 58, 60, 62 and 64. However, only two of these switches 58 and 60 are utilized in this invention. These switches 58 and 60 cooperate with a meter pointer lamp 61 and meter scale or dial lamp 63 and an indicator lamp circuit 66. The switch module 56, indicate lamp circuit and magnetic pull coil 68 form part of a switch assembly-plug 70 which is available as part number X7216096 from IMM Company of Anaheim, California. In addition to the above indicator lamp circuit 66, a plurality of isolation diodes 72 and indicator lamps 74 complete the circuit and indicate the state of switch module 56. If desired, the magnetic pull coil 68 may be activated by an external power supply for activation of switch module 56.

Mode switch 18 is electrically connected between strain gage circuit 22 and voltmeter circuit 20 and depending upon the position thereof will allow meter 16 located within display channel 14 to register a signal from either the strain gage circuit 22 or the voltmeter circuit 20. As a result therefore it is extremely easy to monitor, for example, facility voltages which include voltages from transducers, batteries, current shunts and instruments or monitor pressure, strains or displacements by use of external strain transducer 52.

Although this invention has been described with reference to a particular embodiment it will be understood to those skilled in the art that this invention is also capable of a variety of other embodiments within the spirit and scope of the appended claims.

I claim:

1. A meter box assembly capable of displaying the remote voltage from an external voltage source or the voltage output from an external strain gage transducer, said meter box assembly comprising a housing, said housing having at least one display unit therein, said display unit being in the form of means for displaying said remote voltage or said voltage output from said strain gage transducer, a switching means electrically connected to said display means, a voltmeter circuit, said voltmeter circuit being electrically connected between said external voltage source and said switching means, a strain gage circuit, said strain gage circuit being independent of said voltmeter circuit and electrically connected between said external strain gage transducer and said switching means, said strain gage circuit having a strain gage conditioning module, a switch module, a calibration resistor and an indicator lamp circuit, said external strain gage transducer being electrically connected between said conditioning module, said calibration resistor, said switch module and said indicator lamp circuit, whereby in accordance with the position of said switching means, said display means registers either said remote voltage from said external voltage source or said voltage output from said external strain gage transducer.

2. A meter box assembly as defined in claim 1 wherein said voltmeter circuit comprises a range switch and a plurality of range resistors, said range switch being electrically connected between said external voltage source and said plurality of range resistors.

3. A meter box assembly as defined in claim 2 wherein said voltmeter circuit further comprises a variable range resistor and means for direct access to said display means, said range switch being capable of electrical connection to said variable range resistor or said means for direct access to said display means.

4. A meter box assembly as defined in claim 1 wherein said strain gage conditioning module comprises a power source and an amplifier.

5. A meter box assembly as defined in claim 4 wherein said calibration resistor is electrically connected between one leg of said transducer and said switch module.

6. A meter box assembly as defined in claim 3 wherein said strain gage conditioning module comprises a power source and an amplifier.

7. A meter box assembly as defined in claim 6 wherein said calibration resistor is electrically connected between one leg of said transducer and said switch module.

* * * * *